United States Patent [19]

Johannsmeier

[11] 4,414,749

[45] Nov. 15, 1983

[54] ALIGNMENT AND EXPOSURE SYSTEM WITH AN INDICIUM OF AN AXIS OF MOTION OF THE SYSTEM

[75] Inventor: Karl-Heinz Johannsmeier, Los Altos, Calif.

[73] Assignee: Optimetrix Corporation, Mountain View, Calif.

[21] Appl. No.: 278,402

[22] Filed: Jun. 29, 1981

Related U.S. Application Data

[63] Continuation of Ser. No. 53,995, Jul. 2, 1979, abandoned.

[51] Int. Cl.³ ............................................. G01B 11/27
[52] U.S. Cl. .................................. 33/180 R; 33/184.5; 33/286; 29/574
[58] Field of Search ............. 33/184.5, 180 R, 181 R, 33/286; 29/56 R, 574, 569, 578

[56] References Cited

U.S. PATENT DOCUMENTS

| | | | |
|---|---|---|---|
| 3,192,844 | 7/1965 | Szasz et al. | 33/184.5 |
| 3,461,566 | 8/1969 | Gerstner | 33/180 R |
| 3,476,476 | 11/1969 | Chitayat | 355/1 |
| 3,610,750 | 10/1971 | Lewis et al. | 355/43 |
| 3,685,117 | 8/1972 | Wing et al. | 33/184.5 |
| 3,704,946 | 12/1972 | Brault et al. | 355/46 |
| 3,716,296 | 2/1973 | Springer et al. | 355/53 |
| 3,853,398 | 10/1974 | Kano | 355/43 |
| 3,876,301 | 4/1975 | Kosugi et al. | 355/53 |
| 3,917,399 | 11/1975 | Buzawa | 355/43 |
| 4,057,347 | 11/1977 | Moriyama et al. | 355/67 |
| 4,110,762 | 8/1978 | Tigreat | 354/4 |
| 4,128,331 | 12/1978 | Nakamura | 355/32 |

FOREIGN PATENT DOCUMENTS

| | | |
|---|---|---|
| 1508408 | 11/1967 | France . |
| 2082213 | 12/1971 | France . |
| 2247050 | 2/1975 | France . |
| 2375631 | 7/1978 | France . |
| 2388371 | 11/1978 | France . |

*Primary Examiner*—Steven L. Stephan
*Attorney, Agent, or Firm*—Roland I. Griffin

[57] ABSTRACT

A step-and-repeat alignment and exposure system is provided with a main stage controlled for movement along orthogonal X and Y axes to position either a reference mark or a semiconductive wafer directly beneath a projection lens of the reduction type. The reference mark is formed on a reference mark plate mounted on a substage which is in turn mounted on the main stage and provided with adjustment screws for manually positioning the reference mark plate in a plane parallel to an image plane of the projection lens and for manually positioning the reference mark in alignment with one of the axes of motion of the main stage. Another stage is disposed above the projection lens and controlled for movement along the X and Y axes and about an orthogonal Z axis to position a reticle, held by a vacuum holder and selectively illuminated by a light source unit, with respect to the reference mark. Images of the illuminated portions of the reticle are projected onto the reference mark or the semiconductive wafer by the projection lens. A beam splitter is disposed between the projection lens and the reticle to provide a port for viewing aerial images of the portions of the reference mark or the semiconductive wafer illuminated by the projected images of the illuminated portions of the reticle.

28 Claims, 11 Drawing Figures

ALIGNMENT AND EXPOSURE SYSTEM WITH AN INDICIUM OF AN AXIS OF MOTION OF THE SYSTEM

This is a continuation of application Ser. No. 053,995, filed July 2, 1979, now abandoned.

CROSS-REFERENCE TO RELATED APPLICATIONS

The invention disclosed herein is also disclosed in a previously copending U.S. patent application Ser. No. 026,722 entitled IMPROVED STEP-AND-REPEAT PROJECTION ALIGNMENT AND EXPOSURE SYSTEM, filed on Apr. 3, 1979, by Edward H. Phillips, assigned to the same assignee as the present application, referred to herein by serial number, and incorporated herein by reference. U.S. patent application Ser. No. 026,722 has been abandoned in favor of continuation U.S. patent application Ser. No. 396,099 filed on July 7, 1982. Previously copending U.S. patent application Ser. No. 015,713 entitled INTERFEROMETRICALLY CONTROLLED STAGE WITH PRECISELY ORTHOGONAL AXES OF MOTION and filed on Feb. 27, 1979, by Edward H. Phillips and previously copending U.S. patent application Ser. No. 025,917 entitled OPTICAL FOCUSING SYSTEM and filed on Apr. 2, 1979, by Edward H. Phillips are also assigned to the same assignee as the present application, referred to herein by serial number, and incorporated herein by reference. U.S. patent application Ser. No. 015,713 has been abandoned in favor of continuation U.S. patent application Ser. No. 198,358 filed on Oct. 20, 1980 (issued as U.S. Pat. No. 4,311,390 on Jan. 19, 1982), and U.S. patent application Ser. No. 025,917 has been abandoned in favor of continuation U.S. patent application Ser. No. 183,402 filed on Sept. 2, 1980 (issued as U.S. Pat. No. 4,383,757 on May 17, 1983).

BACKGROUND AND SUMMARY OF THE INVENTION

This invention relates generally to alignment systems for achieving precise relative alignments of a first object, such as a photomask or a reticle, and a second object, such as a semiconductive wafer or a photomask, and, more particularly, to apparatus for use in such systems to facilitate precise positioning of the first object with respect to an axis of motion of a movable stage for holding the second object.

In the semiconductor industry step-and-repeat projection alignment and exposure systems are employed both in the fabrication of photomasks and in the processing of semiconductive wafers to form integrated circuits and the like. A high (sub-micron) resolution photomask is typically fabricated by utilizing a precisely controlled stage movable along coordinate axes of motion to successively position adjacent regions of the photomask with respect to an image (formed by a projection lens) of a reticle containing a level of microcircuitry that is printed on the photomask at each of these regions. This step-and-repeat printing operation forms an array of adjacent regions of microcircuitry of one level on the photomask in rows and columns parallel to the coordinate axes of motion of the stage. A set of such photomasks, each bearing an array of microcircuitry of a different level, is typically employed in the fabrication of integrated circuits or the like from a semiconductive wafer. In the course of this fabrication, the semiconductive wafer is sequentially aligned with each photomask of the set, and the level of microcircuitry printed on the photomask is in turn printed on the semiconductive wafer (this could also be performed in a step-and-repeat printing operation by utilizing a precisely controlled stage movable along coordinate axes of motion to successively position adjacent regions of the semiconductive wafer with respect to each of the photomasks). It is also possible to eliminate the operation of fabricating a set of such photomasks by employing a precisely controlled stage movable along coordinate axes of motion to successively position adjacent regions of the semiconductive wafer with respect to each of the reticles employed in fabricating the set of photomasks so that the level of microcircuitry contained on each of those reticles may be printed directly on the semiconductive wafer at each of those regions during separate step-and-repeat printing operations.

In order, for example, to facilitate the precise positioning or alignment of one level of microcircuitry being printed on a semiconductive wafer at each of an array of adjacent regions thereof relative to another level of microcircuitry previously printed or yet to be printed on the semiconductive wafer at each of those same regions, it would be highly desireable to employ a precisely controlled stage having a visible indicuim of at least one of the coordinate axes of motion of the stage so as to facilitate the precise and repeatable positioning of a photomask or a reticle with respect to that axis of motion of the stage. Unfortunately, however, the stages employed in conventional step-and-repeat alignment and exposure systems do not have such an indicium.

Accordingly, it is the principal object of this invention to provide an improved alignment system with a precisely controlled movable stage having a visible reference mark that is indicative of at least one of coordinate axes of motion of the stage.

These and other objects, which will become apparent from an inspection of the accompanying drawings and a reading of the associated description, are accomplished according to the illustrated preferred embodiment of this invention by providing a step-and-repeat alignment and exposure system including a main stage controlled for movement to different positions along orthogonal X and Y axes; a chuck mounted on the main stage for supporting a semiconductive wafer thereon; a substage mounted on the main stage for aligning a reference mark on the substage with one of the X and Y axes of motion of the main stage; another stage controlled for aligning an image of a reticle supported thereon with the reference mark; a projection lens mounted between the main stage and the other stage for imaging illuminated portions of the reticle onto portions of the reference mark or the semiconductive wafer, depending on the position to which the main stage is moved; a light source for directing illumination and exposure light along an optical path extending through the reticle; a filter mounted for passing light of a wavelength appropriate for the projection lens along that optical path to the reticle; a shutter mounted for selectively controlling the passage of light along that optical path to the reticle; a mask plate mounted for controlling the portions of the reticle illuminated by the light passing along that optical path when the shutter is opened; a beam splitter mounted between the projection lens and the reticle for providing a viewing port at which an aerial image of the portions of the reference mark or semiconductive wafer illuminated by the projected image of the illuminated portions of the reticle may be viewed; and an objective lens unit for use with an ocular lens unit to permit viewing of the aerial image provided at the viewing port while the main stage is controlled to directly align either an image of the reticle with the reference mark or the semiconductive wafer with the reticle.

DESCRIPTION OF THE PREFERRED EMBODIMENT

Figure 1A:
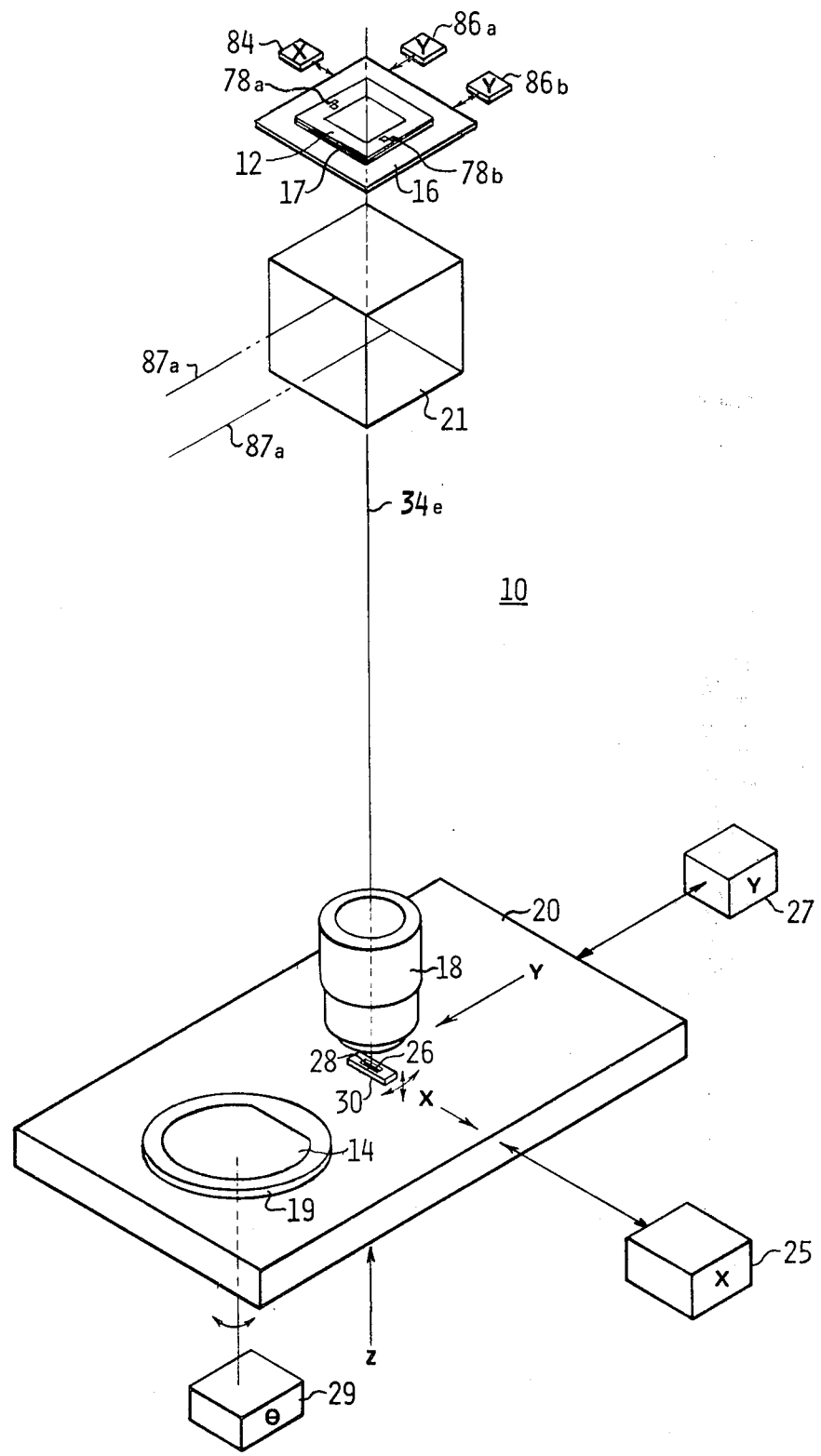
FIG. 1A-C are perspective views of different portions of a step-and-repeat alignment and exposure system in accordance with the preferred embodiment of the present invention.

Referring now to FIGS. 1A-C and 2, there is shown a precision step-and-repeat alignment and exposure system 10 for repeatedly printing one level of microcircuitry, contained on a first object, such as a reticle 12, at an array of adjacent regions of a second object, such as a semiconductive wafer 14, in alignment with other levels of microcircuitry previously printed or yet to be printed at those same regions. Alignment and exposure system 10 includes a stage 16 for holding the reticle 12, a 10:1 projection lens 18 for projecting an image of illuminated portions of the reticle onto a reference mark 26 or the semiconductive wafer 14, a main stage 20 for positioning the reference mark or the semiconductive wafer with respect to the projected image of the illuminated portions of the reticle, a beam splitter 21, a microscope 22 for viewing aerial images of portions of the reference mark or semiconductive wafer illuminated by the projected image of the reticle, and a light source unit 24 for selectively illuminating different portions of the reticle to permit viewing of those aerial images during alignment operations and for selectively exposing a photosensitive film on the semiconductive wafer during step-and-repeat printing operations.

With reference now particularly to FIG. 1A, main stage 20 may comprise an interferometrically-controlled stage of the type shown and described in detail in U.S. patent application Ser. No. 015,713. As fully described in that application, main stage 20 may be moved along orthogonal X and Y axes to any position in a horizontal plane by X and Y axes servo drive units 25 and 27. Either axis of motion of main stage 20 may therefore be employed as an absolute frame of reference, and the X axis is so employed, for alignment and exposure system 10, as hereinafter explained.

Figure 3:
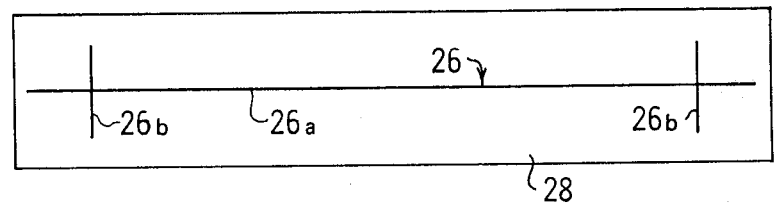
FIG. 3 is a plan view of a reference mark plate employed in the step-and-repeat alignment and exposure system of FIGS. 1A-C.

Reference mark 26 may be formed of bright chrome on a reference mark plate 28 fixedly mounted on a substage 30, which is in turn adjustably mounted on main stage 20. As best shown in FIG. 3, reference mark 26 may comprise a straight line 26a of about 12.7 millimeters in length and about 4 microns in width, and a pair of identical tic marks 26b of about 0.4 millimeters in length and about 4 microns in width. These tic marks 26b symmetrically and orthogonally intersect line 26a near the opposite ends thereof and are spaced 10.3 millimeters apart (center-to-center).

Figure 4A:
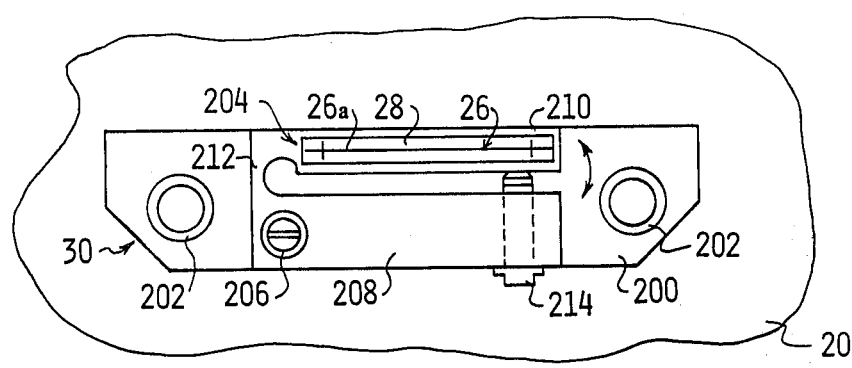
FIGS. 4A and 4B are top plan and side elevational views, respectively, of a substage employed in the step-and-repeat alignment and exposure system of FIGS. 1A-C to support the reference mark plate of FIG. 3.
Figure 4B:
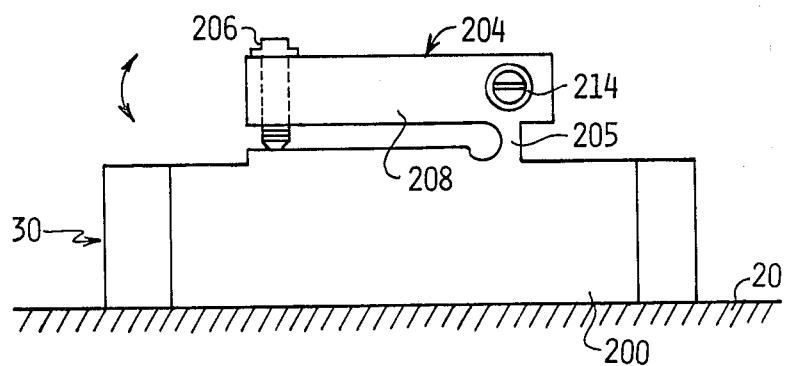

As best shown in FIGS. 4A and 4B, substage 30 may comprise a lower base member 200 fixedly secured to main stage 20 by screws or rivets 202, and an adjustable upper support member 204 secured to the lower base member, for example, by a solid hinge 205 permitting pivotal adjustment of the upper support member with respect to the plane of main stage 20 under control of an adjustment screw 206. This adjustment screw is screwed through a threaded screw hole in a first side portion 208 of upper support member 204 and into abutment with the upper surface of lower base member 200 so as to permit positioning of the upper surface of the upper support member and, hence, of reference mark plate 28 in a plane parallel to a first image plane 77 (see FIG. 2) of projection lens 18 as desired for proper focusing of reference mark 26. A second smaller side portion 210 of upper support member 204 is secured to the first side portion 208, for example, by another solid hinge 212 permitting angular adjustment of the upper surface of the second side portion of the upper support member (and, hence, of reference mark plate 28, which is fixedly secured to that surface by an adhesive) in a plane parallel to the upper surface of main stage 20 under control of an adjustment screw 214. This adjustment screw is screwed through a threaded screw hole in the first side portion 208 of the upper support member 204 and into abutment with the smaller second side portion 210 of the upper support member so as to permit precise alignment of line 26a of reference mark 26 with the X axis of motion of the main stage as desired to provide a visual indication of the X axis of motion and thereby facilitate use of the X axis of motion as an absolute frame of reference for alignment and exposure system 10. In initially setting up alignment and exposure system 10, substage 30 is manually adjusted (by adjustscrews 206 and 214 to achieve the desired parallel-plane positioning of reference mark plate 28 and the desired alignment of line 26a of reference mark 26. Although this substage adjustment operation should only have to be performed once during the life of alignment and exposure system 10, it may be advisable to check the parallel-plane positioning of reference mark plate 28 and the alignment of line 26a of reference mark 26 from time to time. The manner in which the substage adjustment operation is performed will now be described with reference to the parts of alignment and exposure system 10 employed in that operation.

Figure 1B:
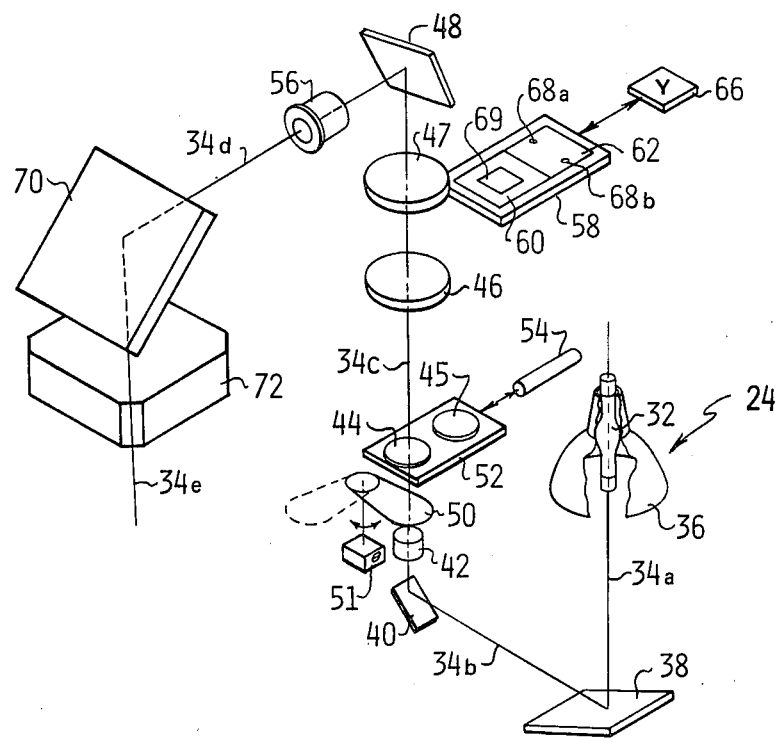

With reference now particularly to FIG. 1B, light source unit 24 includes a mercury arc lamp 32 for emitting a spectrum of light energy including both green illuminating light having a wave length of about 547 nanometers for illuminating but not exposing the photosensitive film on semiconductive wafer 12, and blue illuminating and exposure light having a wavelength of about 436 nanometers for both illuminating and exposing the photosensitive film on the semiconductive wafer (herein simply referred to as exposure light). Mercury arc lamp 32 is fixedly mounted along a vertically extending portion 34a of an optical path 34a-e of alignment and exposure system 10. An elliptical reflector 36 surrounds mercury arc lamp 32 and is fixedly coaxially mounted therewith for projecting a beam of light emitted by the mercury arc lamp downward to a band reflecting plane mirror 38. This band reflecting plane mirror 38 has a multilayer dielectric coating for reflecting blue and green light, but transmitting all other light, in the beam of light to prevent unnecessary energy from being transmitted along the remaining portions of optical path 34a-e. Band reflecting plane mirror 38 is fixedly mounted in optical path 34a-e at an angle of forty-five degrees with respect to the vertically extending portion 34a thereof so as to deflect the blue and green light in the beam of light along a horizontally extending portion 34b of that optical path to a plane mirror 40.

Plane mirror 40 is fixedly mounted in optical path 34a-e at an angle of forty-five degrees with respect to the horizontally extending portion 34b thereof so as to deflect the beam of blue and green light incident thereon upward along another vertically extending portion 34c of that optical path. The beam of light so deflected thereupon passes through a light integrator 42 and, when a normally closed shutter 50 is opened as during the substage adjustment operation, also through a blue or a green filter 44 or 45 and a pair of positive lenses 46 and 47 to a plane mirror 48. Light integrator 42 is fixedly mounted in the vertically extending portion 34c of optical path 34a-e and is employed for providing the beam of light passing therethrough with a cross section corresponding to the entrance pupil of projection lens 18 and with a uniform intensity distribution in the plane of reticle 12.

Shutter 50 is pivotally mounted adjacent to the vertically extending portion 34c of optical path 34a-e and is controlled by a θ servo drive unit 51 for pivotal movement into that optical path (as shown in solid lines) when closed so as to block passage of the beam of light therealong and for pivotal movement out of that optical path (as shown in dashed lines) when opened so as to permit passage of the beam of light therealong. Blue filter 44 and green filter 45 are fixedly mounted in horizontally spaced relationship on a slide 52 which is in turn reciprocally mounted in a horizontal plane orthogonally intersecting the vertically extending portion 34c of optical path 34a-e. Slide 52 is moved along the Y axis under control of an air cylinder 54 to position either the blue filter 44 or the green filter 45 in the path of the beam of blue and green light passing upward along the vertically extending portion 34c of optical path 34a-e when shutter 50 is opened. Blue filter 44 is normally so positioned and therefore passes the blue light in the beam of light to the pair of positive lenses 46 and 47 while filtering out the green light and any other non-blue light that may still be present in the beam of light.

Figure 5:
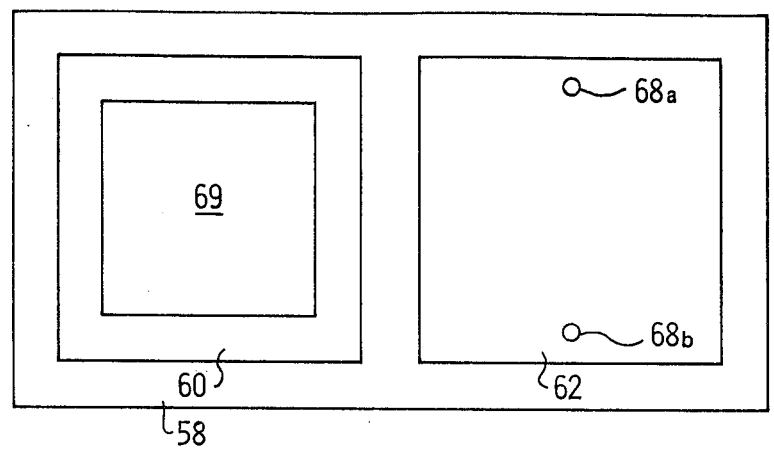
FIG. 5 is a plan view of a slide holding two different masks employed in the step-and-repeat alignment and exposure system of FIGS. 1A-C.

Positive lenses 46 and 47 are fixedly mounted in the vertically extending portion 34c of optical paths 34a-e to image the output of light integrator 42 at the entrance pupil of an imaging lens 56. A slide 58 is mounted for movement along the Y axis under control of a Y axis servo drive unit 66 to selectively position either of two separate mask plates 60 and 62 at an operative position directly between positive lenses 46 and 47 in a horizontal plane orthogonally intersecting the vertically extending portion 34c of optical path 34a-e at a point midway between those positive lenses. Light appearing in this plane between positive lenses 46 and 47 is imaged onto reticle 12. During the substage adjustment operation, slide 58 is moved by Y axis servo drive unit 66 to locate mask plate 62 in an operative position between positive lenses 46 and 47 so that a pair of small circular openings 68a and 68b of mask plate 62 (best shown in FIG. 5) permit the blue light passed by blue filter 44 to illuminate a corresponding pair of circular areas about 2 millimeters in diameter disposed on the surface of reticle 12 and containing a pair of reticle alignment marks 78a and 78b, respectively.

Plane mirror 48 is fixedly mounted in optical path 34a-e at an angle of forty-five degrees with respect to the vertically extending portion 34c thereof so as to deflect the incident light along a horizontally extending portion 34d of that optical path through imaging lens 56 to a plane mirror 70. Imaging lens 56 is fixedly mounted along the horizontally extending portion 34d of optical path 34a-e and is employed to image the light passing through mask plate 62 at the surface of reticle 12. Plane mirror 70 is fixedly mounted in optical path 34a-e at an angle of forty-five degrees with respect to the horizontally extending portion 34d thereof so as to deflect the light incident thereon downward along a vertically extending portion 34e of that optical path. This downwardly deflected light passes through a positive lens 72, reticle 12, and beam splitter 21 to projection lens 18. Positive lens 72 is fixedly mounted along the vertically extending portion 34e of optical path 34a-e so as to image light appearing at the output pupil of imaging lens 56 at the input pupil of projection lens 18.

Figure 2:
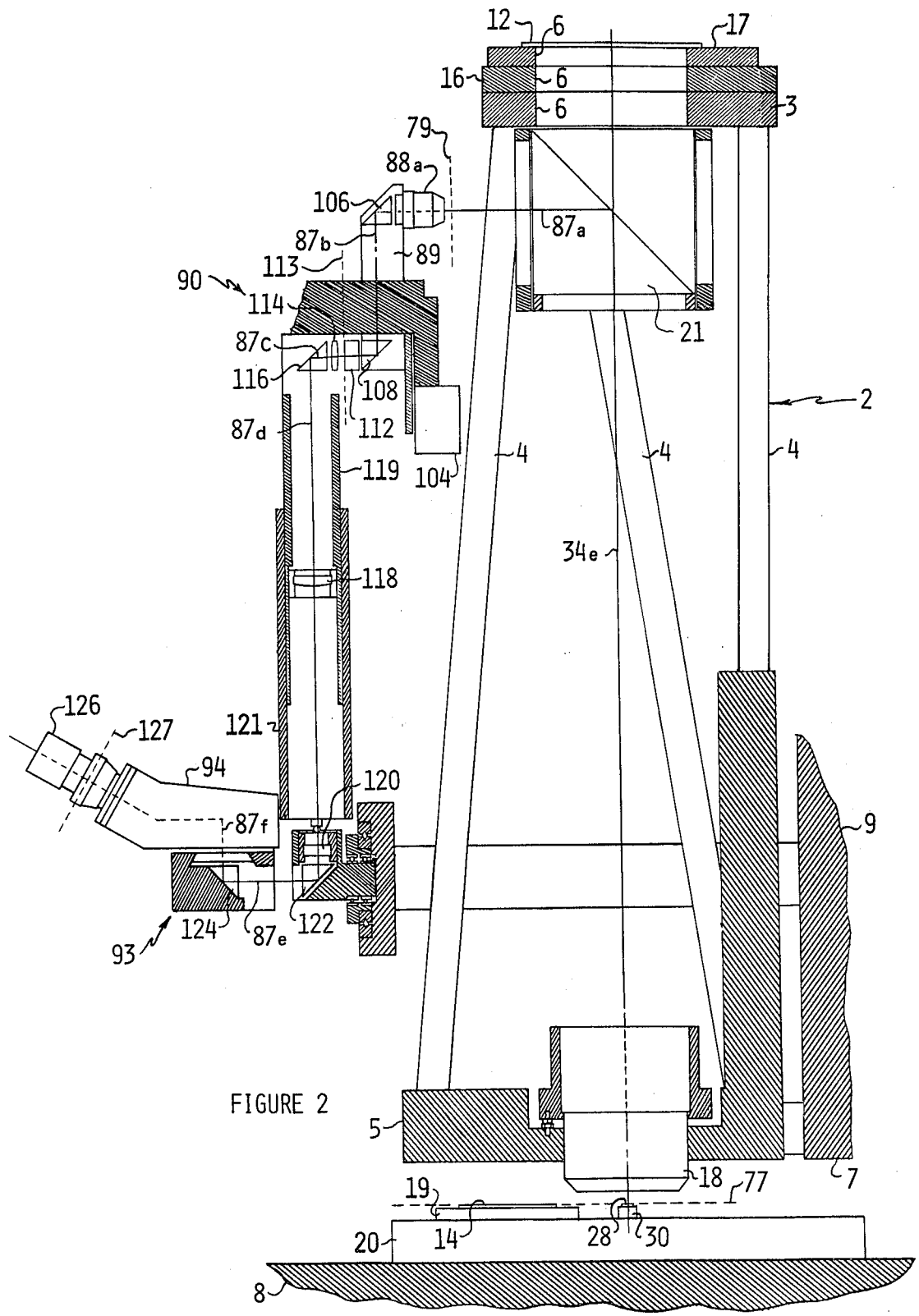
FIG. 2 is a half-sectional, partially cut-away elevational view of a portion of the step-and-repeat alignment and exposure system of FIGS. 1A-C.
Figure 6:
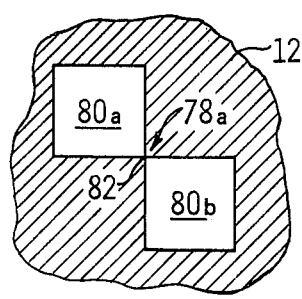
FIG. 6 is a plan view of one of a pair of reticle alignment marks contained on each reticle employed with the step-and-repeat alignment and exposure system of FIGS. 1A-C.

With reference now particularly to FIGS. 1A and 2, each reticle 12 to be employed with alignment and exposure system 10 has a pair of oppositely-facing reticle alignment marks 78a and 78b spaced 103 millimeters apart (center-to-center) along the X axis when the reticle is properly aligned on stage 16. As best shown in FIG. 6, each reticle alignment mark 78a or 78b may comprise a pair of light or transparent windows 80a and 80b (each about 0.75 millimeters square) on a dark or opaque field. These windows 80a and 80b are symmetrically disposed about the center 82 of the alignment mark on opposite sides of a pair of orthogonal centerlines of the alignment mark (one of those centerlines being coincident with a common centerline of both alignment marks). Stage 16 is provided with a vacuum holder 17, as shown in FIG. 2, for releasably holding reticle 12 in place, and is moved by X and differentially-controlled Y axes servo drive units 84, 86a, and 86b to adjust the X, Y, and θ orientation of the reticle as required to precisely align images of the reticle alignment marks 78a and 78b of the reticle with reference mark 26 as hereinafter explained.

Beam splitter 21 is mounted in the vertically extending portion 34e of optical path 34a-e so as to pass eighty percent of the light passing through reticle 12 to projection lens 18, which is also mounted in that portion of optical path 34a-e. A compensating lens may be pivotally mounted adjacent to projection lens 18 for movement out of the vertically extending portion 34e of optical path 34a-e, when blue light is passing therealong to the projection lens (as is normally the case), and for movement into the vertically extending portion 34e of that optical path, when green light is passing therealong to the projection lens, to compensate for the difference in wavelength of the green light and the blue light since the projection lens is corrected for the blue light only.

Projection lens 18 focuses the light passing through reticle 12 at the first image plane 77 adjacent to main stage 20 and directly beneath the projection lens, thereby projecting images of illuminated portions of reticle 12 (and, hence, of the reticle alignment marks 78a and 78b contained on the reticle and illuminated by mask plate 62 when shutter 50 is opened) onto whatever object is positioned in that image plane directly beneath the projection lens. The portions of that object onto which those images are projected are therefore illuminated by the blue light passing through the transparent reticle alignment marks 78a and 78b on reticle 12. Twenty percent of the light reflected vertically upward from those portions of that object through projection lens 18 is reflected by beam splitter 21 along horizontally extending portions 87a of a dual optical path 87a-f to a second image plane 79 positioned the same optical distance from the beam splitter as is the reticle 12 and positioned between the beam splitter and objective lenses 88a and 88b of compound microscope 22 (see also FIG. 1C). Projection lens 18 focuses this reflected light at the second image plane 79 thereby projecting an aerial image of those portions of the object positioned in the first image plane 77 directly beneath the projection lens (i.e., those portions illuminated by the projected images of the reticle alignment marks 78a and 78b contained on the reticle 12) to the second image plane.

Figure 1C:
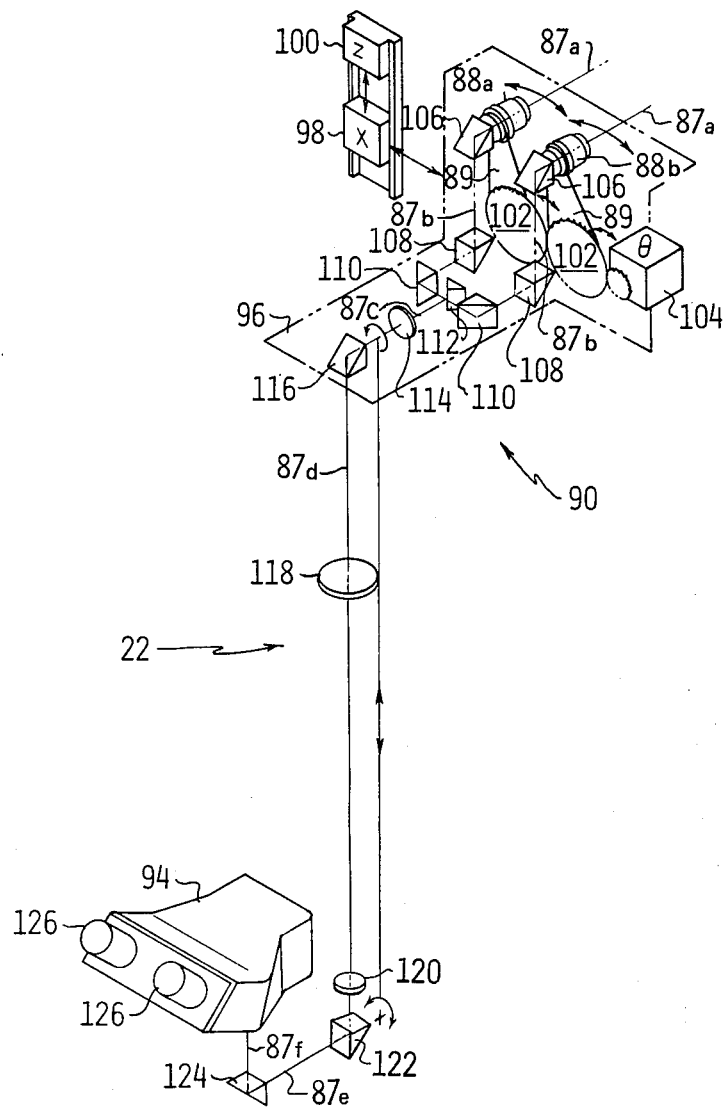

With reference now particularly to FIGS. 1C and 2, compound microscope 22 includes an objective lens unit 90 employed with a binocular lens unit 93 in the substage adjustment operation as hereinafter explained. The objective lens unit 90 is mounted on a stage 96 horizontally movable along the X axis under control of an X axis servo drive unit 98 and vertically movable along a Z axis orthogonal to the X and Y axes under control of a Z axis servo drive unit 100. Each of the objective lenses 88a and 88b comprises a 5:1 objective lens mounted on an associated arm 89, which is in turn pivotally mounted on stage 96 and coupled by a gear mechanism 102 to a θ servo drive unit 104 (both of which are also mounted on stage 96) for moving the objective lenses closer together or further apart. Objective lenses 88a and 88b are disposed along corresponding ones of the horizontally extending portions 87a of dual optical path 87a-f adjacent to the second image plane 79 for receiving light therefrom. Thus, the objective lenses 88a and 88b can be moved with respect to the second image plane 79 as desired for viewing any portions of the aerial image projected to that image plane.

A separate beam bender 106 is mounted on each arm 89 along each horizontally extending portion 87a of dual optical path 87a-f for deflecting light passing through the corresponding objective lens 88a or 88b generally downward along a corresponding downwardly extending portion 87b of dual optical path 87a-f to another corresponding beam bender 108. Each beam bender 108 is mounted on the same arm 89 as the corresponding beam bender 106 for pivotal movement therewith as the objective lenses 88a and 88b are moved closer together or further apart. Beam benders 108 are mounted along the corresponding downwardly extending portions 87b of dual optical path 87a-f for deflecting light from the corresponding beam benders 106 along corresponding horizontally extending portions 87c of dual optical path 87a-f to corresponding beam benders 110 from which that light is deflected along other corresponding horizontally extending portions 87c of dual optical path 87a-f to corresponding faces of a split field prism 112. Split field prism 112 in turn deflects light from each beam bender 110 in side-by-side relationship along a common horizontally extending portion 87c of dual optical path 87a-f through a field lens 114 to another beam bender 116. Beam benders 110, split field prism 112, and field lens 114 are fixedly mounted on stage 96 along the respective horizontally extending portions 87c of dual optical path 87a-f.

Beam bender 116 is mounted along the common horizontally extending portion 87c of dual optical path 87a-f for swivel movement thereabout and is disposed for deflecting light passing through field lens 114 downward along a downwardly extending portion 87d of that dual optical path through positive lenses 118 and 120 to a beam bender 122. Positive lenses 118 and 120 and beam bender 122 are mounted along the downwardly extending portion 87d of dual optical path 87a-f for swivel movement with beam bender 116 about the common horizontally extending portion 87c of that dual optical path, and to allow relative axial movement between positive lens 118 (which is fixedly mounted in a first tube 119 in fixed relation to beam bender 116) and positive lens 120 (which is mounted on a second tube 121 in fixed relation to beam bender 122, the first and second tubes 119 and 121 being slidably and coaxially disposed one within the other) as the length of the downwardly extending portion 87d of the dual optical path is changed by relative movement of beam benders 116 and 122. Thus, the downwardly extending portion 87d of dual optical path 87a-f may be moved with stage 96. Beam bender 122 deflects light passing through positive lense 118 and 120 forward along a horizontally extending portion 87e of dual optical path 87a-f to a beam bender 124. This beam bender 124 is fixedly mounted along the horizontally extending portion 87e of dual optical path 87a-f for deflecting light from beam bender 122 upward along a vertically extending portion 87f of dual optical path 87a-f to ocular lenses 126 of binocular head 94, which is fixedly mounted along that portion of the dual optical path.

The various elements of objective lens unit 90 and binocular lens unit 93 are arranged along dual optical path 87a-f as described above so that the aerial image viewed in the second image plane 79 by objective lenses 88a and 88b is reimaged at a third image plane 113 directly in front of split field prism 112. Positive lens 118 is provided with a focal length equal to the distance back along dual optical path 87a-f to the third image plane 113, and positive lens 120 is provided with a focal length equal to the distance forward along that dual optical path to a fourth image plane 127 directly in front of ocular lenses 126. Positive lenses 118 and 120 therefore serve as a relay lens unit for reimaging the reimaged image appearing in the third image plane 113 at the fourth image plane 127 and for accommodating changes in the length of the downwardly extending portion 87d of dual optical path 87a-f while transmitting light passing between those positive lenses in parallel rays as required to maintain proper focus.

As shown in FIG. 2 and described in U.S. patent application Ser. No. 025,917, stage 16, beam splitter 21, and projection lens 18 are securely mounted on a tower 2. This tower 2 comprises an upper platform 3 on which stage 16 and beam splitter 21 are mounted, six upright rods 4 on which the upper platform is securely mounted, and a base 5 on which the rods 4 and the projection lens 18 are securely mounted. Stage 16, the reticle holder 17 mounted thereon, and the upper platform 3 of tower 2 are provided with clearance openings 6 permitting light passing through the reticle 12 to pass along the vertically extending portion 34e of dual optical path 34a-f through projection lens 18 to whatever object is positioned directly beneath the projection lens. The base 5 of tower 2 is mounted by air bearings on a casting 7, which is in turn fixedly mounted on a granite block 8 on which main stage 20 is mounted as described in U.S. patent application Ser. No. 0.15,713. Base 5 of tower 2 is vertically movable with respect to the casting 7 (and, hence, granite block 8) so as to permit vertical movement of the tower and, hence, projection lens 18 relative to main stage 20 under control of an automatic optical focusing system described in U.S. patent application Ser. No. 025,917. All of the elements of objective lens unit 90 and of binocular lens unit 93 are securely mounted on an upright portion 9 of casting 7. In addition, all of the elements of light source unit 24 shown in FIG. 1B are mounted on an upright post (not shown) which is in turn rotatably mounted on casting 7 so as to permit those elements to be pivoted away from the other portions of alignment and exposure system 10 for ease of service.

Referring now to FIGS. 1A-C and 2, the substage adjustment operation is performed by employing the X and Y servo drive units 25 and 27 for moving main stage 20 so as to position reference mark plate 28 directly beneath projection lens 18 with the end portions (including tic marks 26b) of reference mark 26 (which is nominally oriented along the X axis) illuminated by the projected images of reticle alignment marks 78a and 78b (i.e., by the blue light passing through those reticle alignment marks) contained on reticle 12. Concomitantly, the X and Z axes servo drive units 98 and 100 and the θ servo drive unit 104 are employed for moving stage 96 and spacing objective lenses 88a and 88b of objective lens unit 90 as to position those objective lenses for viewing the aerial images of the illuminated end portions of reference mark 26. Since prior to adjustment of substage 30, reference mark plate 28 is likely disposed adjacent to and intersecting, rather than in, the first image plane 77, both of these aerial images of the illuminated and portions of reference mark plate 28 will be out of focus adjacent to and intersecting, rather than in, the first image plane 77, both of these aerial images of the illuminated end portions of reference mark plate 28 will be out of focus (one end portion likely being disposed above and the other end portion below the first image plane). While viewing these out-of-focus aerial images, the operator employs adjustment screw 206 (see FIGS. 4A-B) to manually adjust the upper support member 204 of substage 30 with respect to the plane of main stage 20, and the automatic focusing system described in U.S. patent application Ser. No. 0.25,917 automatically moves tower 2 so as to track the average pivotal movement of the upper support member of the substage until both of these aerial images are brought into focus. At this point reference mark plate 28 is precisely positioned in and parallel to the first image plane 77, and the aerial images of the end portions of reference mark 26 illuminated by the projected images of reticle alignment marks 78a and 78b contained on reticle 12 are in focus.

Figure 7:
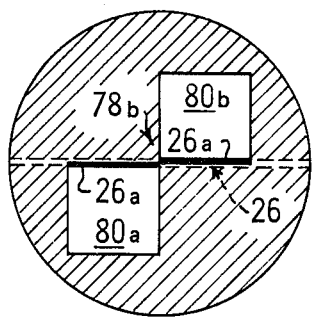
FIG. 7 is a plan view of a portion of a reference mark formed on the reference mark plate of FIG. 3 and illuminated by a reticle alignment mark.

While employing one of the objective lenses of objective lens unit 90, for example, the right hand objective lens 88b, to view one of the focused aerial images (for example, the aerial image of the end portion of reference mark 26 illuminated by the projected image of the right hand reticle alignment mark 78b), the operator employs the X axis servo drive unit 25 for moving main stage 20 back and forth along the X axis in a shuttle mode so as to alternately position each end portion of the reference mark in the projected image of the right hand reticle alignment mark 78b and thereby pass line 26a of the reference mark back and forth through that projected image as shown in FIG. 7. If line 26a of reference mark 26 is not precisely aligned with the X axis of motion of main stage 20, this back-and-forth movement of the main stage causes the illuminated portion of line 26a to rise and fall within the projected image of the right hand reticle alignment mark 78b. The operator thereupon employs adjustment screw 214 (see FIGS. 4A-B) to manually adjust the angular position of the second side portion 210 of substage 30 until the illuminated portion of line 26a of reference mark 26 does not rise and fall within the projected image of the right hand reticle alignment mark (i.e., remains in the position shown in FIG. 7) as main stage 20 is moved back and forth. This precisely aligns line 26a of reference mark 26 with the X axis of motion of main stage 20 and establishes the reference mark as an absolute frame of reference for precision alignment operations to be performed with alignment and exposure system 10 as hereinafter explained.

A set of n different reticles 12, each containing a different level of microcircuitry to be successively printed at each of an array of adjacent regions of semiconductive wafer 14 in alignment with other levels of microcircuitry previously printed or yet to be printed at those same regions, is employed in the fabrication of integrated circuits or the like from the semiconductive wafer. Following the substage adjustment operation, alignment and exposure system 10 may be successively employed with each reticle 12 of the set to successively perform each of these step-and-repeat printing operations on every semiconductive wafer 14 of a batch of semiconductive wafers being processed by the alignment and exposure system, as described in U.S. patent application Ser. No. 026,722. Either the first reticle 12 of the first set of reticles to be employed with alignment and exposure system 10 or a special set-up reticle may be employed to perform the previously-described substage adjustment operation.

Figure 8:
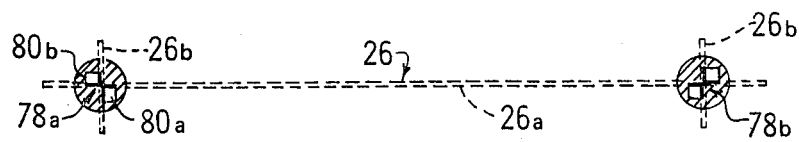
FIG. 8 is a plan view of the end portions of the reference mark formed on the reference mark plate of FIG. 3 and illuminated by projected images of a pair of reticle alignment marks.

During each step-and-repeat printing operation, the reticle 12 being employed must first be precisely aligned with reference mark 26 on substage 30 and, hence, with respect to the X axis of motion of main stage 20. This is accomplished by placing the reticle 12 on vacuum holder 17 of steps 16 in nominal alignment with the X axis of motion of main stage 20; by employing X and Y axis servo drive units 25 and 27 for moving the main stage to a position at which reference mark 26 is centered directly beneath projection lens 18 with the end portions of the reference mark nominally aligned with the images of the reticle alignment marks 78a and 78b of the reticle to be projected onto reference mark plate 28 when shutter 50 is opened; by employing Y axis servo drive unit 66 for moving slide 58 to a position at which mask plate 62 is located in the same operative position between positive lenses 46 and 47 as previously described; by employing θ servo drive unit 51 to open shutter 50 so as to illuminate the reticle alignment marks 78a and 78b on the reticle and, hence, the end portions of reference mark 26 falling within the projected images of those reticle alignment marks; by employing the X axis, Z axis, and θ servo drive units 98, 100, and 104, to position the objective lenses 88a and 88b for viewing the aerial images of the end portions of reference mark 26 illuminated by the images of the reticle alignment marks 78a and 78b projected onto those end portions; and, while viewing those aerial images, by employing the X axis and differential Y axis servo drive units 84, 86a, and 86b for moving reticle 12 to precisely align the images of the reticle alignment marks 78a and 78b contained on the reticle with the illuminated end portions of reference mark 26 as shown in FIG. 8. When so aligned the images of transparent windows 80a and 80b of each reticle alignment mark 78a and 78b are symmetrically disposed with respect to the line 26a and intersecting tic mark 26b of the respective end portion of reference mark 26. It should be noted that many of the foregoing steps of the reticle alignment operation will already have been performed in the case of the first reticle of the first set of reticles being employed with alignment and exposure system 10 if that reticle is initially employed, rather than a special set-up reticle, in performing the previously described substage adjustment operation.

Once the reticle 12 has been aligned with reference mark 26 on substage 30, main stage 20 is employed to selectively position the semiconductive wafer 14 with respect to the projection lens 18 and a wafer prealignment system (not shown), as described in detail in U.S. patent application Ser. No. 026,722, in order to print wafer alignment marks on the semiconductive wafer, prealign the semiconductor wafer with respect to the reference mark 26 (and, hence, with respect to the reticle 12), and print a pattern on the reticle at each of an array of adjacent regions of the semiconductor wafer. To facilitate some of these operations, the semiconductive wafer 14 is held by a vacuum chuck 19 mounted on main stage 20 for rotation about an axis parallel to the Z axis of the system under control of a θ servo drive unit 29.

I claim:
1. Alignment apparatus comprising:
an adjustable holder for holding a first object in a first plane;
imaging means for producing an image of the first object in a second plane;
a stage for holding a second object in the second plane;
control means for moving the stage along coordinate axes to position the second object with respect to the image of the first object;
an indicium of facilitating alignment of the image of the first object with respect to at least one of the axes of motion of the stage; and
adjustable mounting means for mounting the indicium on the stage in the second plane to facilitate positioning the indicium in alignment with respect to said one of the axes of motion of the stage;
said control means also being operable for moving the stage along the coordinate axes to position the indicium with respect to the image of the first object.

2. Apparatus as in claim 1 wherein said adjustable mounting means may also be employed to facilitate positioning the indicium in a plane parallel to and coincident with the second plane.

3. Apparatus as in claim 2 wherein said adjustable mounting means comprises a substage mounted on the stage, said substage including:
a first adjustment member for adjusting the substage to position the indicium in a plane parallel to and coincident with the second plane; and
a second adjustment member for adjusting the substage to position the indicium in alignment with respect to said one of the axes of motion of the stage.

4. Apparatus as in claim 1 wherein said stage is movable along the coordinate axes to an extent at least as great as the size of an image of substantially the entire first object.

5. Apparatus as in claim 1 including:
control means for moving the holder to position the first object with respect to the indicium; and
optical means for viewing the indicium and the first object.

6. Apparatus as in claim 1 including:
a light source for illuminating the first object;
said imaging means being operble for projecting an image of an illuminated portion of the first object into the second plane; and
optical means, including the imaging means, for viewing an image of a portion of the indicium illuminated by a projected image of an illuminated portion of the first object.

7. Apparatus as in claim 1 including:
a light source for illuminating the first object;
said imaging means being operable for projecting an image of an illuminated portion of the first object into the second plane; and
optical means, including the imaging means, for viewing an image of different portions of the indicium illuminated by a projected image of an illuminated portion of the first object, while employing the control means for moving the stage in a shuttle mode along said one of the axes of motion of the stage, to facilitate positioning the indicium in alignment with respect to said one of the axes of motion of the stage.

8. Apparatus as in claim 1 including:
control means for moving the holder to position the first object with respect to the indicium;
a light source for illuminating the first object;
said imaging means being operable for projecting an image of an illuminated portion of the first object into the second plane; and
optical means, including the imaging means, for viewing an image of a portion of the indicium illuminated by a projected image of a portion of the first object, while employing the last-mentioned control means for moving the holder, to facilitate alignment of the projected image of that portion of the first object with respect to the illuminated portion of the indicium.

9. Apparatus as in clam 1 including:
control means for translatably and rotatably moving the holder to position the first object with respect to the indicium;
a light source for illuminating the first object;
said imaging means being operable for projecting an image of an illuminated portion of the first object into the second plane; and optical means, including the imaging means, for viewing an image of spaced alignment mark portions of the indicium illuminated by a projected image of corresponding spaced alignment mark portions of the first object, while employing the last-mentioned control means for moving the holder, to facilitate alignment of the projected image of those spaced alignment mark portions of the first object with respect to the illuminated spaced alignment mark portions of the indicium.

10. Apparatus as in claim 1 wherein:
said indicium comprises a reference mark;
said adjustable mounting means and the second object are disposed at spaced positions on the stage; and
said control means is operable for moving the stage along the coordinate axes to operatively position the reference mark with respect to the imaging means and also for moving the stage along the coordinate axes to operatively position the second object with respect to the imaging means.

11. Apparatus as in claim 1 wherein:
said indicium comprises a reference mark;
said apparatus includes optical means for viewing the reference mark and the first object; and
said apparatus further includes control means for moving the holder to position the first object with respect to the reference mark.

12. Apparatus as in claim 1 wherein said imaging means comprises a projection lens, optically disposed between the holder and the stage, for projecting an image of illuminated portions of the first object into the second plane.

13. Apparatus as in claim 1 wherein:
said first object comprises a reticle; and
said second object comprises a semiconductive wafer.

14. Apparatus as in claim 1 wherein said holder is movable rotatably and along coordinate axes to facilitate alignment of an image of first and second alignment marks of the first object with respect to the indicium.

15. Apparatus as in claim 1 wherein:
said imaging means comprises a projection lens, optically disposed between the holder and the stage, for projecting an image of illuminated portions of the first object into the second plane; and
said holder is movable rotatably and along coordinate axes to facilitate alignment of an image of first and second alignment marks of the first object with respect to the indicium.

16. Apparatus as in claim 1 wherein:
said imaging means comprises a projection lens, optically disposed between the holder and the stage, for projecting an image of illuminated portions of the first object into the second plane;
said first object comprises a reticle;
said second object comprises a semiconductive wafer; and
said holder is movable rotatably and along coordinate axes to facilitate alignment of an image of first and second alignment marks of the first object with respect to the indicium.

17. Apparatus as in claim 1 wherein:
said first object comprises a reticle;
said second object comprises a semiconductive wafer;
said indicium comprises a reference mark;
said apparatus includes a light source for illuminating the reticle;
said imaging means comprises a projection lens, optically disposed between the holder and the stage, for projecting an image of illuminated portions of the reticle into the second plane; and
said apparatus includes optical means, including the projection lens, for viewing an image of a portion of the reference mark illuminated by a projected image of an illuminated portion of the reticle.

18. Apparatus as in claim 1 wherein:
said first object comprises a reticle;
said second object comprises a semiconductive wafer;
said indicium comprises a reference mark;
said apparatus includes a light source for illuminating the reticle;
said imaging means comprises a projection lens, optically disposed between the holder and the stage, for projecting an image of illuminated portions of the reticle into the second plane; and
said apparatus includes optical means, including the projection lens, for viewing an image of different portions of the reference mark illuminated by a projected image of an illuminated portion of the reticle, while employing the control means for moving the stage in a shuttle mode along said one of the axes of motion of the stage, to facilitate positioning the reference mark in alignment with respect to said one of the axes of motion of the stage.

19. Apparatus as in claim 1 wherein:
said first object comprises a reticle having an alignment mark portion;
said indicium comprises a reference mark having an alignment mark portion;
said second object comprises a semiconductive wafer;
said apparatus includes a light source for illuminating the reticle;
said imaging means comprises a projection lens, optically disposed between the holder and the stage, for projecting an image of illuminated portions of the reticle into the second plane;
said apparatus includes control means for moving the holder to position the reticle with respect to the reference mark; and
said apparatus further includes optical means, including the projection lens, for viewing an image of the alignment mark portion of the reference mark illuminated by a projected image of the alignment mark portion of the reticle, while employing the last-mentioned control means for moving the holder to facilitate alignment of the projected image of that alignment mark portion of the reticle with respect to the illuminated portion of the alignment mark portion of the reference mark.

20. Apparatus as in claim 1 wherein:
said first object comprises a reticle having a pair of spaced alignment marks portions;
said indicium comprises a reference mark having a corresponding pair of spaced alignment mark portions;
said second object comprises a semiconductive wafer;
said apparatus includes a light source for illuminating the reticle;
said imaging means comprises a projection lens, optically disposed between the holder and the stage, for projecting an image of illuminated portions of the reticle into the second plane;
said apparatus includes control means for translatably and rotatably moving the holder to position the reticle with respect to the referene mark; and said apparatus further includes optical means, including the projection lens, for viewing an image of the pair of spaced alignment mark portions of the reference mark illuminated by a projected image of the corresponding pair of spaced alignment mark portions of the reticle, while employing the last-mentioned control means for moving the holder, to facilitate alignment of the projected image of that pair of spaced alignment mark portions of the reticle with respect to the illuminated pair of spaced alignment mark portions of the reference mark.

21. Apparatus as in claim 3 including:
a light source for illuminating the first object;
said imaging means being operable for projecting an image of an illuminated portion of the first object into the second plane; and
optical means, including the imaging means, for viewing an image of a portion of the indicium illuminated by a projected image of an illuminated portion of the first object.

22. Apparatus as in claim 3 including:
a light source for illuminating the first object;
said imaging means being operable for projecting an image of an illuminated portion of the first object into the second plane; and
optical means, including the imaging means, for viewing an image of different portions of the indicium illuminated by a projected image of an illuminated portion of the first object, while employing the control means for moving the stage in a shuttle mode along said one of the axes of motion of the stage, to facilitate positioning the indicium in alignment with respect to said one of the axes of motion of the stage.

23. Apparatus as in claim 3 including:
control means for moving the holder to position the first object with respect to the indicium;
a light source for illuminating the first object;
said imaging means being operable for projecting an image of an illuminated portion of the first object into the second plane; and
optical means, including the imaging means, for viewing an image of a portion of the indicium illuminated by a projected image of a portion of the first object, while employing the last-mentioned control means for moving the holder, to facilitate alignment of the projected image of that portion of the first object with respect to the illuminated portion of the indicium.

24. Apparatus as in claim 3 including:
control means for translatably and rotatably moving the holder to position the first object with respect to the indicium;
a light source for illuminating the first object;
said imaging means being operable for projecting an image of an illuminated portion of the first object into the second plane; and
optical means, including the imaging means, for viewing an image of spaced alignment mark portions of the indicium illuminated by a projected image of corresponding spaced alignment mark portions of the first object, while employing the last-mentioned control means for moving the holder, to facilitate alignment of the projected image of those spaced alignment mark portions of the first object with respect to the illuminated spaced alignment mark portions of the indicium.

25. Apparatus as in claim 3 wherein:
said first object comprises a reticle;
said second object comprises a semiconductive wafer;
said indicium comprises a reference mark;
said apparatus includes a light source for illuminating the reticle;
said imaging means comprises a projection lens, optically disposed between the holder and the stage, for projecting an image of illuminated portions of the reticle into the second plane; and
said apparatus includes optical means, including the projection lens, for viewing an image of a portion of the reference mark illuminated by a projected image of an illuminated portion of the reticle.

26. Apparatus as in claim 3 wherein:
said first object comprises a reticle;
said second object comprises a semiconductive wafer;
said indicium comprises a reference mark;
said apparatus includes a light source for illuminating the reticle;
said imaging means comprises a projection lens, optically disposed between the holder and the stage, for projecting an image of illuminated portions of the reticle into the second plane; and
said apparatus includes optical means, including the projection lens, for viewing an image of different portions of the reference mark illuminated by a projected image of an illuminated portion of the reticle, while employing the control means for moving the stage in a shuttle mode along said one of the axes of motion of the stage, to facilitate positioning the reference mark in alignment with respect to said one of the axes of motion of the stage.

27. Apparatus as in claim 3 wherein:
said first object comprises a reticle having an alignment mark portion;
said indicium comprises a reference mark having an alignment mark portion;
said second object comprises a semiconductive wfer;
said apparatus includes a light source for illuminating the reticle;
said imaging means comprises a projection lens, optically disposed between the holder and the stage, for projecting an image of illuminated portions of the reticle into the second plane;
said apparatus includes control means for moving the holder to position the reticle with respect to the reference mark; and
said apparatus further includes optical means, including the projection lens, for viewing an image of the alignment mark portion of the reference mark illuminated by a projected image of the alignment mark portion of the reticle, while employing the last-mentioned control means for moving the holder, to facilitate alignment of the projected image of that alignment mark portion of the reticle with respect to the illuminated portion of the alignment mark portion of the reference mark.

28. Apparatus as in claim 3 wherein:
said first object comprises a reticle having a pair of spaced alignment mark portions;
said indicium comprises a reference mark having a corresponding pair of spaced alignment mark portions;
said second object comprises a semiconductive wafer;
said apparatus includes a light source for illuminating the reticle;
said imaging means comprises a projection lens, optically disposed between the holder and the stage, for projecting an image of illuminated portions of the reticle into the second plane;

said apparatus includes control means for translatably and rotatably moving the holder to position the reticle with respect to the reference mark; and said apparatus further includes optical means, including the projection lens, for viewing an image of the pair of spaced alignment mark portions of the reference mark illuminated by a projected image of the corresponding pair of spaced alignment mark portions of the reticle, while employing the last-mentioned control means for moving the holder, to facilitate alignment of the projected image of that pair of spaced alignment mark portions of the reticle with respect to the illuminated pair of spaced alignment mark portions of the reference mark.

* * * * *